United States Patent
Eum et al.

(10) Patent No.: US 11,766,765 B2
(45) Date of Patent: Sep. 26, 2023

(54) SUBSTRATE TREATMENT APPARATUS

(71) Applicant: SEMES CO., LTD., Chungcheongnam-do (KR)

(72) Inventors: Ki Sang Eum, Chungcheongnam-do (KR); Byoung Ok Kim, Chungcheongbuk-do (KR); Jae Hun Jeong, Chungcheongnam-do (KR); Ju Eun Kim, Chungcheongnam-do (KR); Jun Ho Seo, Seoul (KR); Man Kyu Kang, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 676 days.

(21) Appl. No.: 16/693,569

(22) Filed: Nov. 25, 2019

(65) Prior Publication Data

US 2020/0171626 A1 Jun. 4, 2020

(30) Foreign Application Priority Data

Nov. 30, 2018 (KR) ........................ 10-2018-0152105

(51) Int. Cl.
*B25B 11/00* (2006.01)
*H01L 21/68* (2006.01)
*H01L 21/687* (2006.01)
*H01L 21/683* (2006.01)

(52) U.S. Cl.
CPC ............ *B25B 11/005* (2013.01); *H01L 21/68* (2013.01); *H01L 21/6838* (2013.01); *H01L 21/68735* (2013.01); *H01L 21/68742* (2013.01); *H01L 2221/68309* (2013.01)

(58) Field of Classification Search
CPC ................. H01L 21/6838; H01L 21/68; H01L 21/68735; H01L 21/68728; H01L 21/68785
See application file for complete search history.

(56) References Cited

U.S. PATENT DOCUMENTS

| 6,844,921 B2 | 1/2005 | Komatsu |
| 2006/0174836 A1* | 8/2006 | Lee ................... H01L 21/67103 118/728 |

(Continued)

FOREIGN PATENT DOCUMENTS

| CN | 104798191 | * | 7/2015 |
| CN | 104798191 A | * | 7/2015 |

(Continued)

OTHER PUBLICATIONS

Korean Notification of Reason for Refusal for Korean Application No. 10-2018-0152105, dated May 11, 2020 with translation, 10 pages.

*Primary Examiner* — Mahdi H Nejad
(74) *Attorney, Agent, or Firm* — RatnerPrestia

(57) ABSTRACT

A substrate treatment apparatus is provided. The substrate treatment apparatus includes a substrate support part provided with a seating surface and configured to support a substrate, a guide ring annularly disposed along an edge of the substrate support part to surround the substrate, and a centering part provided inside the guide ring and configured to center the substrate by moving in a direction parallel to the seating surface to pressurize the edge of the substrate.

13 Claims, 16 Drawing Sheets

(56) References Cited

U.S. PATENT DOCUMENTS

| | | | |
|---|---|---|---|
| 2006/0278977 A1* | 12/2006 | Ruth | G01R 31/2893 257/726 |
| 2007/0257085 A1* | 11/2007 | Fukuda | H01L 21/6838 228/101 |
| 2009/0173446 A1 | 7/2009 | Yang et al. | |
| 2010/0071847 A1* | 3/2010 | Shin | H01L 21/67092 156/382 |
| 2011/0034034 A1 | 2/2011 | Du Bois et al. | |
| 2014/0311532 A1* | 10/2014 | Yokoyama | H01L 21/68728 134/33 |
| 2021/0301871 A1* | 9/2021 | Fesperman, Jr. | F16C 32/0622 |

FOREIGN PATENT DOCUMENTS

| | | | |
|---|---|---|---|
| JP | 0837227 A | | 2/1996 |
| JP | 2003158173 A | | 5/2003 |
| KR | 1020040073173 A | | 8/2004 |
| KR | 20090048202 | * | 5/2009 |
| KR | 1020090075367 A | | 7/2009 |
| KR | 20090048202 A | * | 10/2009 |
| KR | 20150087117 A | * | 7/2015 |
| KR | 101681897 B1 | | 12/2016 |
| KR | 20180069383 A | | 6/2018 |

* cited by examiner

SUBSTRATE TREATMENT APPARATUS

CROSS-REFERENCE TO RELATED APPLICATIONS

This application claims priority from Korean Patent Application No. 10-2018-0152105 filed on Nov. 30, 2018 in the Korean Intellectual Property Office, the disclosure of which is incorporated herein by reference in its entirety.

BACKGROUND

1. Field of the Disclosure

The present disclosure relates to a substrate treatment apparatus.

2. Description of the Related Art

When manufacturing a semiconductor device or a display device, various processes such as photolithography, etching, ashing, ion implantation, thin film deposition, cleaning, and the like are performed. Here, the photolithography process includes a coating process, an exposure process, and a developing process. A photoresist is applied onto a substrate (that is, a coating process), a circuit pattern is exposed on the substrate formed with a photoresist film (that is, an exposure process), and an exposed area of the substrate is selectively developed (that is, a developing process).

A phenomenon in which a substrate is warped may occur while the substrate is being fixed. In particular, the warping phenomenon may occur when the substrate is heated. For example, the substrate may be heated to remove moisture prior to applying a photoresist, or the substrate may be heated after the photoresist is applied. The warpage of the substrate may be corrected by cooling.

SUMMARY

Aspects of the present disclosure provide a substrate treatment apparatus.

It should be noted that objects of the present disclosure are not limited to the above-described objects, and other objects of the present disclosure will be apparent to those skilled in the art from the following descriptions.

According to an aspect of the present disclosure, there is provided a substrate treatment apparatus including a substrate support part provided with a seating surface and configured to support a substrate, a guide ring annularly disposed along an edge of the substrate support part to surround the substrate, and a centering part provided inside the guide ring and configured to center the substrate by moving in a direction parallel to the seating surface to pressurize the edge of the substrate.

The substrate support part may include a first air suction nozzle and a second air suction nozzle that are configured to suction air, the first air suction nozzle may fix the substrate to the substrate support part with a suction force, and the second air suction nozzle may suction particles present between the substrate and the substrate support part with a suction force.

The first air suction nozzle may be disposed to be adjacent to a center of the seating surface, and the second air suction nozzle may be disposed along an edge of the seating surface.

The guide ring may include an inner side plate having a wide surface, which is perpendicular to the seating surface, and formed in an annular shape to surround the substrate, and an inclined plate formed to annularly extend from an upper end of the inner side plate to surround the substrate and having a diameter that increases away from the seating surface.

A height of the inner side plate with respect to the seating surface may be formed to be greater than a height of the edge of the substrate supported on the substrate support part.

The substrate support part may include a support pin that supports the substrate, the substrate may include a warpage substrate in which a distance between an edge of the substrate and the seating surface is formed to be greater than a distance between a center portion of the substrate and the seating surface, and the height of the inner side plate with respect to the seating surface may be formed to be greater than the height of the edge of the warpage substrate that is supported on the support pin.

The substrate treatment apparatus may further include a heating part attached to the substrate support part and configured to heat the substrate.

The centering part may include a body formed to be elongated to one side thereof, a head provided at one side end of the body and configured to move together with the body to pressurize the edge of the substrate, and elastic bodies each having one side fixed to the substrate support part and the other side connected to the body to provide an elastic force to elastically move the body with respect to the substrate support part.

The elastic bodies may include a first elastic body disposed on one side of the body and a second elastic body disposed on the opposite side to the one side on which the first elastic body is disposed with the body as a center.

An assembly of the body, the first elastic body, and the second elastic body may have a plate shape, and the assembly may have a wide surface disposed to be parallel to the seating surface.

The head may include an inclined part whose diameter decreases toward the substrate.

The guide ring may include a through-hole having an inclined surface corresponding to a shape of the inclined part, and a portion of the head may be exposed to the outside of the through-hole to pressurize the edge of the substrate when the inclined part is brought into contact with the inclined surface.

The substrate support part may include an air nozzle configured to inject air, the head may be moved to pressurize the edge of the substrate as the air injected from the air nozzle pushes the body, and when the air injection of the air nozzle is stopped, the body may be returned to an original position thereof by the elastic force of the elastic bodies to release a pressure applied on the edge of the substrate by the head.

The substrate support part may include an air nozzle configured to suction air, when the air suction of the air nozzle is stopped, the head connected to the body by the elastic force of the elastic bodies may pressurize the edge of the substrate, and when the air nozzle suctions the air to pull the body, the head may be moved to release a pressure applied on the edge of the substrate by the head.

Other specific contents according to the exemplary embodiments are included in the detailed descriptions and the accompanying drawings.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Figure 1:
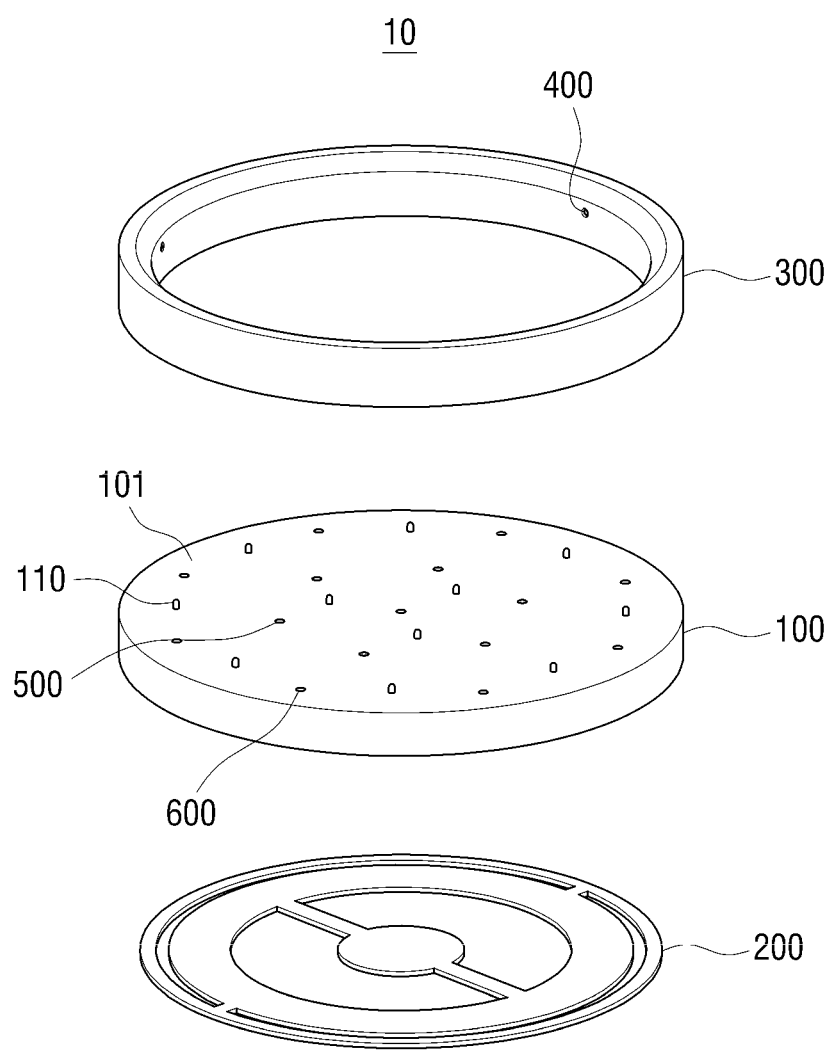
FIGS. 1 and 2 are views illustrating a substrate treatment apparatus according to an exemplary embodiment of the present disclosure.

Hereinafter, exemplary embodiments of the present disclosure will be described in detail with reference to the accompanying drawings. The advantages and features of the present disclosure and methods for obtaining the same will be apparent from the following detailed description of the exemplary embodiments described with references to the following drawings. However, the present disclosure is not limited to the exemplary embodiments to be disclosed below and may be implemented in different various forms. The present exemplary embodiments are provided in order to fully explain the present disclosure and fully explain the scope of the present disclosure to those skilled in the art. The scope of the present disclosure is only defined by the appended claims. Like reference numerals refer to like elements throughout the specification.

A case in which an element or layer is referred to as being "on" another element or layer includes a case in which the element is directly present on another element or layer and also includes a case in which the element is present on another element or layer with still another element or layer interposed therebetween. However, a case in which an element is referred to as being "directly on" another element includes a case in which still another element or layer is not interposed therebetween.

Spatially relative terms such as "below," "beneath," "lower," "above," "upper," and the like may be used to more easily describe a relationship between one element or component and another element or another component as illustrated in the drawings. The spatially relative terms should be understood to have directions as illustrated in the drawings and have other directions when the elements are used or operated. For example, when an element illustrated in the drawing is turned upside down, the element which is illustrated to be present below or beneath another element may be present above another element. Accordingly, the term "below" used as an example includes both "below" and "above." An element may be arranged in another direction, and thus, the spatially relative terms may be interpreted based on an arrangement direction.

Although first, second, and the like are used to describe various elements, components, and/or sections, the various elements, components, and/or sections are not limited thereto. The terms are only for distinguishing one element or component, or sections from another element or component, or sections. Therefore, a first element, a first component, or a first section may also be a second element, a second component, or a second section in the technical spirit of the present disclosure.

The terms used herein are for the purpose of describing the exemplary embodiments and are not intended to limit the present disclosure. Unless the context clearly indicates otherwise in the specification, the singular forms include the plural forms. The terms "comprises," "comprising," "includes," and/or "including," when used herein, specify the presence of stated features, integers, steps, operations, elements, components and/or groups thereof, and do not preclude the presence or addition of one or more other features, integers, steps, operations, elements, components, and/or groups thereof.

Unless otherwise defined, all terms (including technical and scientific terms) used herein may be used in a sense commonly understood by those skilled in the art to which the present disclosure pertains. It will be further understood that terms, such as those defined in commonly used dictionaries, will not be interpreted in an idealized or overly formal sense unless expressly so defined here.

Hereinafter, the exemplary embodiments of the present disclosure will be described in detail with reference to the accompanying drawings. When the exemplary embodiments are described with reference to the accompanying drawings, components that are the same or correspond to each other are denoted by the same reference numerals regardless of the figure numbers, and redundant descriptions will be omitted.

Figure 2:
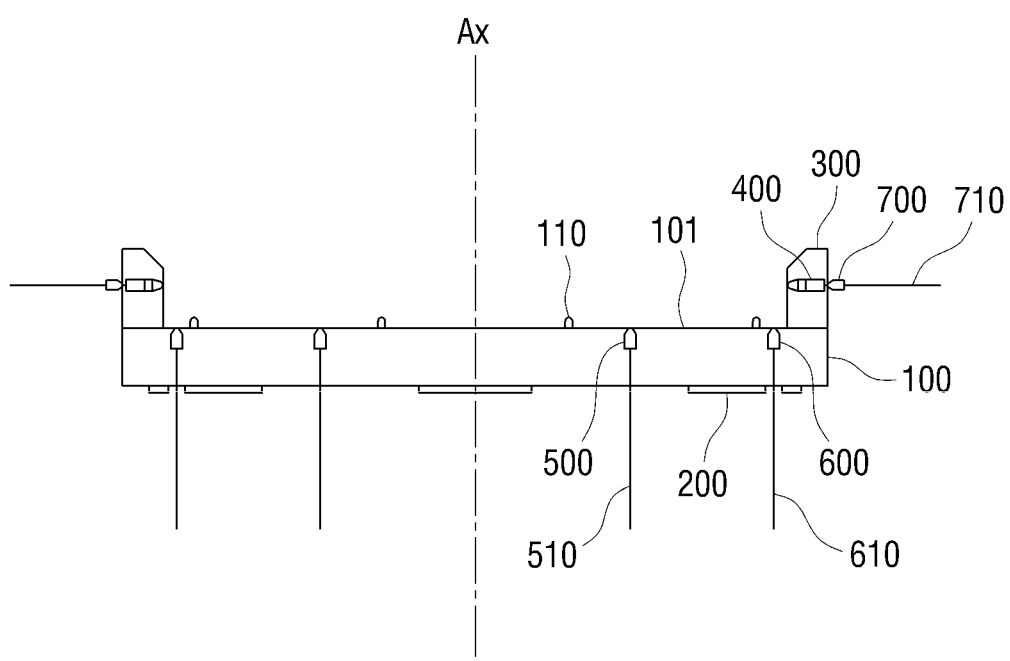

FIGS. 1 and 2 are views illustrating a substrate treatment apparatus according to an exemplary embodiment of the present disclosure.

Referring to FIGS. 1 and 2, a substrate treatment apparatus 10 includes a substrate support part 100, a heating part 200, a guide ring 300, and a centering part 400.

The substrate support part 100 is provided with a seating surface 101 and plays the role of supporting a substrate. The seating surface 101 may have a wide surface parallel to the ground. For example, a chuck may perform the role of the substrate support part 100.

The substrate support part 100 may include a support pin 110. The support pin 110 may protrude from the seating surface 101 to support the substrate. Since the support pin 110 supports the substrate, a predetermined distance may be maintained between the substrate and the seating surface 101.

The substrate support part 100 may include first and second air suction nozzles 500 and 600 that suction air. Openings of the first and second air suction nozzles 500 and 600 may be exposed to the seating surface 101. The first and second air suction nozzles 500 and 600 may be connected to first and second air suction lines 510 and 610, respectively. The first and second air suction nozzles 500 and 600 may be connected to one ends of the first and second air suction lines 510 and 610, respectively, and air pumps (not shown) may be provided at the other ends of the first and second air suction lines 510 and 610, respectively. When the air pumps operate, air around the first and second air suction nozzles 500 and 600 may be introduced into the first and second air suction nozzles 500 and 600 and moved along the first and second air suction lines 510 and 610.

The first air suction nozzle 500 serves to fix the substrate to the substrate support part 100 with suction force. The first air suction nozzle 500 may be disposed to be adjacent to a center of the seating surface 101. The substrate may be fixed to the substrate support part 100 by the suction force of the first air suction nozzle 500.

The second air suction nozzle 600 serves to suction particles existing between the substrate and the substrate support part 100. In particular, the particles generated by the centering part 400 may be removed through the second air suction nozzle 600. To this end, the second air suction nozzle 600 may be disposed along an edge of the seating surface 101, and specifically, may be disposed to be adjacent to an inner side plate 310 of the guide ring 300 (see FIG. 3). As will be described below, the centering part 400 may include elastic bodies 431 and 432 and thus may be deformed. The centering part 400 may generate particles by itself while being deformed and may also generate the particles due to friction with surrounding objects. In addition, the centering part 400 may operate using an air injection force of an air nozzle 700, and thus the particles generated in the centering part 400 may be introduced into an upper space of the substrate support part 100 through holes formed in the guide ring 300. The particles introduced into the substrate support part 100 from the centering part 400 may be removed by suction force of the second air suction nozzle 600.

The heating part 200 is attached to the substrate support part 100 and serves to heat the substrate. For example, the heating part 200 may generate heat as power is supplied thereto. The heat of the heating part 200 may move along the substrate support part 100 to be transferred to the substrate supported by the substrate support part 100. In order to allow the heat of the heating part 200 to be smoothly transferred to the substrate, the substrate support part 100 may be made of a material having a relatively high heat transfer rate.

The guide ring 300 may be annularly disposed along an edge of the substrate support part 100 to surround the substrate. In the present disclosure, the guide ring 300 serves to guide the disposition of the substrate. For example, the guide ring 300 serves to assist in centering the substrate with respect to the substrate support part 100. In addition, as will be described below, the guide ring 300 serves to enhance the suction force of the first air suction nozzle 500.

The guide ring 300 may be provided with the centering part 400. The centering part 400 serves to center the substrate. The seating surface 101 of the substrate support part 100 and the substrate may have a circular shape with one center. The center of the substrate and the center of the seating surface 101 may be matched with or close to each other due to the centering part 400.

The centering part 400 may be provided inside the guide ring 300. The centering part 400 may move in a direction parallel to the seating surface 101 and pressurize an edge of the substrate to center the substrate. A plurality of centering parts 400 may be provided. The plurality of centering parts 400 simultaneously move toward a central axis Ax of the substrate support part 100 to pressurize the edge of the substrate so that the center of the substrate is matched with the center of the substrate support part 100. In the present disclosure, the central axis Ax of the substrate support part 100 represents a virtual axis that is perpendicular to the seating surface 101 and passes through a center point of the substrate support part 100 having a circular plate shape.

The guide ring 300 may include an air nozzle 700 for the operation of the centering part 400. The air nozzle 700 may operate the centering part 400 by injecting or suctioning air. The air nozzle 700 may be connected to an air line 710. The air nozzle 700 may be connected to one end of the air line 710, and an air pump (not shown) may be provided at the other end of the air line 710. When the air pump operates, air transferred through the air line 710 may be injected through the air nozzle 700, or air suctioned into the air nozzle 700 may be transferred through the air line 710. A detailed description of the operation of the centering part 400 will be described below with reference to FIGS. 11 and 12 and 15 and 16.

Figure 3:
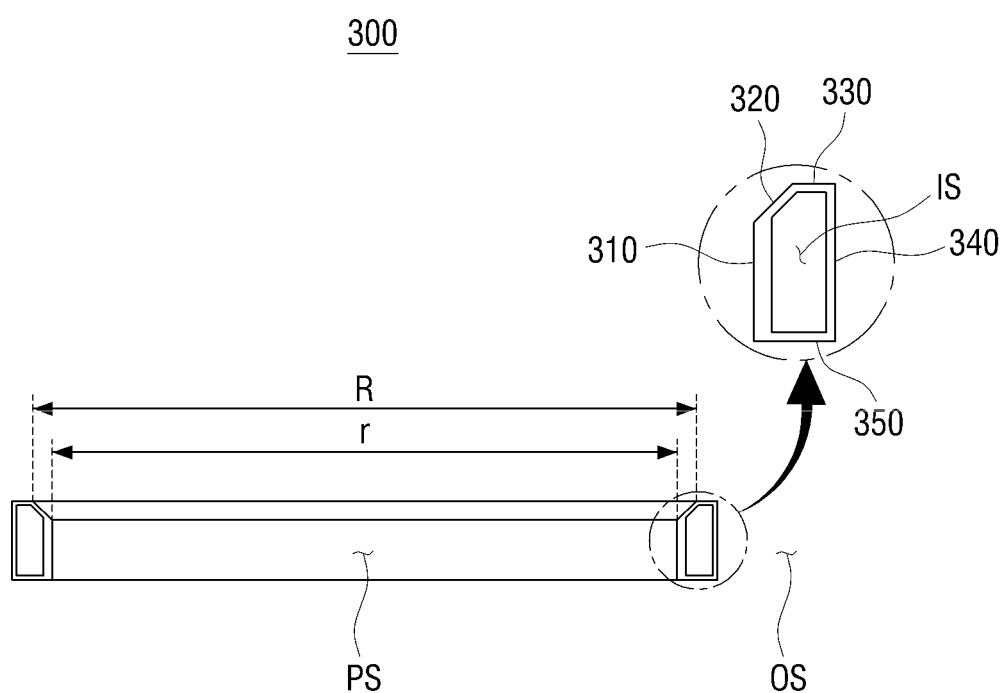
FIG. 3 is a cross-sectional view of a guide ring according to the exemplary embodiment of the present disclosure.

FIG. 3 is a cross-sectional view of the guide ring according to the exemplary embodiment of the present disclosure.

Referring to FIG. 3, the guide ring 300 includes the inner side plate 310, an inclined plate 320, an upper side plate 330, an outer side plate 340, and a lower side plate 350.

The inner side plate 310 and the outer side plate 340 may have a wide surface perpendicular to the seating surface 101 of the substrate support part 100 and may be formed in an annular shape to surround the substrate. Centers of the inner side plate 310 and the outer side plate 340 may exist on the central axis Ax of the substrate support part 100, and the outer side plate 340 may have a diameter greater than that of the inner side plate 310.

The inclined plate 320 may be formed to annularly extend from an upper end of the inner side plate 310 to surround the substrate. Since the inner side plate 310 and the inclined plate 320 are formed in an annular shape, the peripheral space of the guide ring 300 may be divided into a seating space PS on which the substrate is seated and an outer space OS on the basis of the guide ring 300.

The inclined plate 320 may increase in diameter away from the seating surface 101. FIG. 3 illustrates a case in which the smallest diameter of the inclined plate 320 is r, and the greatest diameter of the inclined plate 320 is R. The inclined plate 320 serves to assist in centering the substrate. When the edge of the substrate is brought into contact with the inclined plate 320 while the substrate is seated on the substrate support part 100, the edge of the substrate in contact with the inclined plate 320 is moved to the seating space PS due to the inclined plate 320, the height of which is lowered toward the seating space PS from the outer space OS.

The upper side plate 330 and the lower side plate 350 may have a wide surface parallel to the seating surface 101 of the substrate support part 100 and may be formed in an annular shape to surround the substrate. The upper side plate 330 may be connected to the inclined plate 320 and the outer side plate 340, and the lower side plate 350 may be connected to the inner side plate 310 and the outer side plate 340.

Since the inner side plate 310, the inclined plate 320, the upper side plate 330, the outer side plate 340, and the lower side plate 350 are connected to each other, a predetermined space may be formed inside the guide ring 300. The centering part 400 described above may be provided in the corresponding space.

Figure 4:
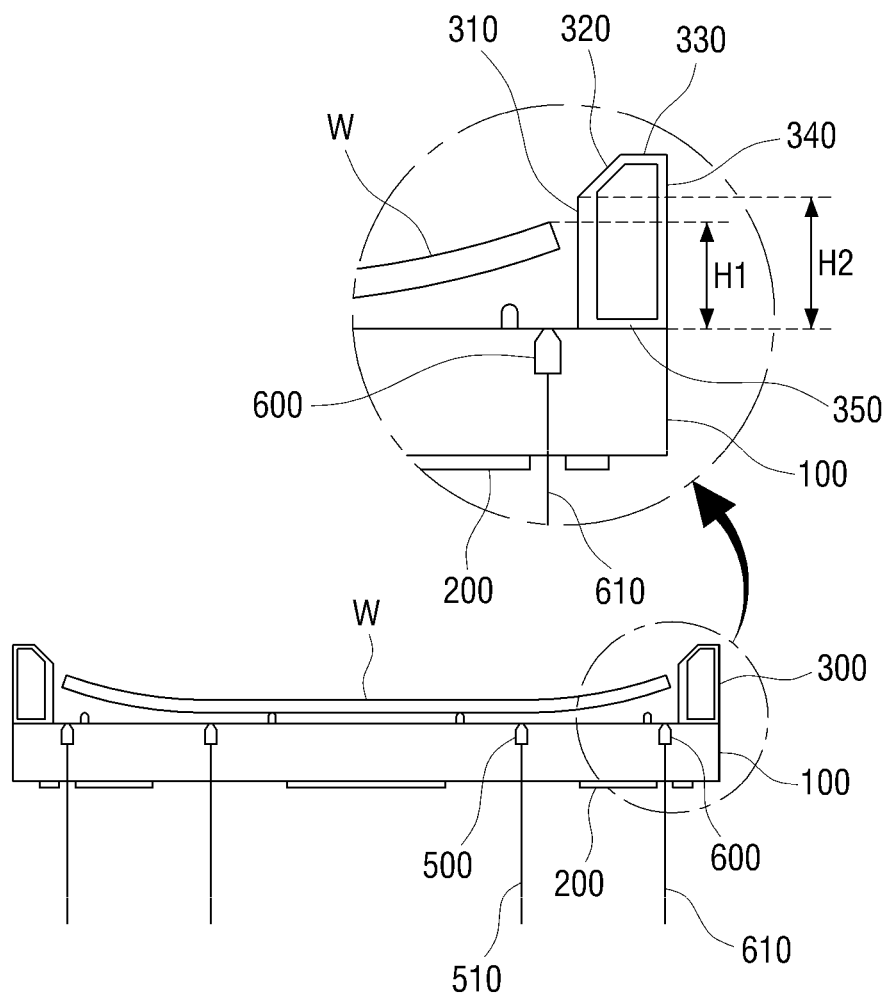
FIG. 4 is a view illustrating that the substrate is seated on the substrate treatment apparatus according to the exemplary embodiment of the present disclosure.

FIG. 4 is a view illustrating that the substrate is seated on the substrate treatment apparatus according to the exemplary embodiment of the present disclosure.

Referring to FIG. 4, the guide ring 300 may envelop an edge of a substrate W seated on the substrate support part 100.

As described above, the substrate W may be fixed to the substrate support part 100 by the suction force of the first air suction nozzle 500. The substrate W is supported by the support pin 110 and spaced apart from the seating surface 101 by a predetermined distance, and to this end, the first air suction nozzle 500 needs to continuously suction the surrounding air to fix the substrate W to the substrate support part 100. Meanwhile, when the air introduced through the edge of the substrate W is excessively great, the suction force of the first air suction nozzle 500 for fixing the substrate W to the substrate support part 100 may be weakened.

The guide ring 300 according to the exemplary embodiment of the present disclosure serves to enhance the suction force of the first air suction nozzle 500 for fixing the substrate W to the substrate support part 100 by reducing the amount of air introduced through the edge of the substrate W. Since the guide ring 300 is disposed along the edge of the substrate W, a gap may be formed between the edge of the substrate W and the guide ring 300, and air may only be introduced through the corresponding gap.

A height H2 of the inner side plate 310 with respect to the seating surface 101 may be formed to be greater than a height H1 of the edge of the substrate W supported by the substrate support part 100. When the height H2 of the inner side plate 310 with respect to the seating surface 101 is smaller than the height H1 of the edge of the substrate W, the gap may be increased, but since the height H2 of the inner side plate 310 with respect to the seating surface 101 is formed to be greater than the height H1 of the edge of the substrate W, the gap may be prevented from being increased. In particular, the substrate W may be supported by the support pin 110, and the height H2 of the inner side plate 310 may be formed to be greater than the height H1 of the edge of the substrate that is supported by the support pin 110.

In the present disclosure, the substrate W may be a warpage substrate. For example, the substrate W may be a warpage substrate in which the distance between an edge of the substrate W and the seating surface 101 is formed to be greater than the distance between a center portion of the substrate W and the seating surface 101. In addition, the warpage substrate W may be supported by the support pin 110. The height H2 of the inner side plate 310 with respect to the seating surface 101 may be formed to be greater than the height H1 of the edge of the warpage substrate W supported by the support pin 110. Accordingly, the gap formed between the edge of the substrate W and the guide ring 300 may be prevented from being expanded, and the suction force of the first air suction nozzle 500 for fixing the substrate W to the substrate support part 100 may be enhanced.

Figure 5:
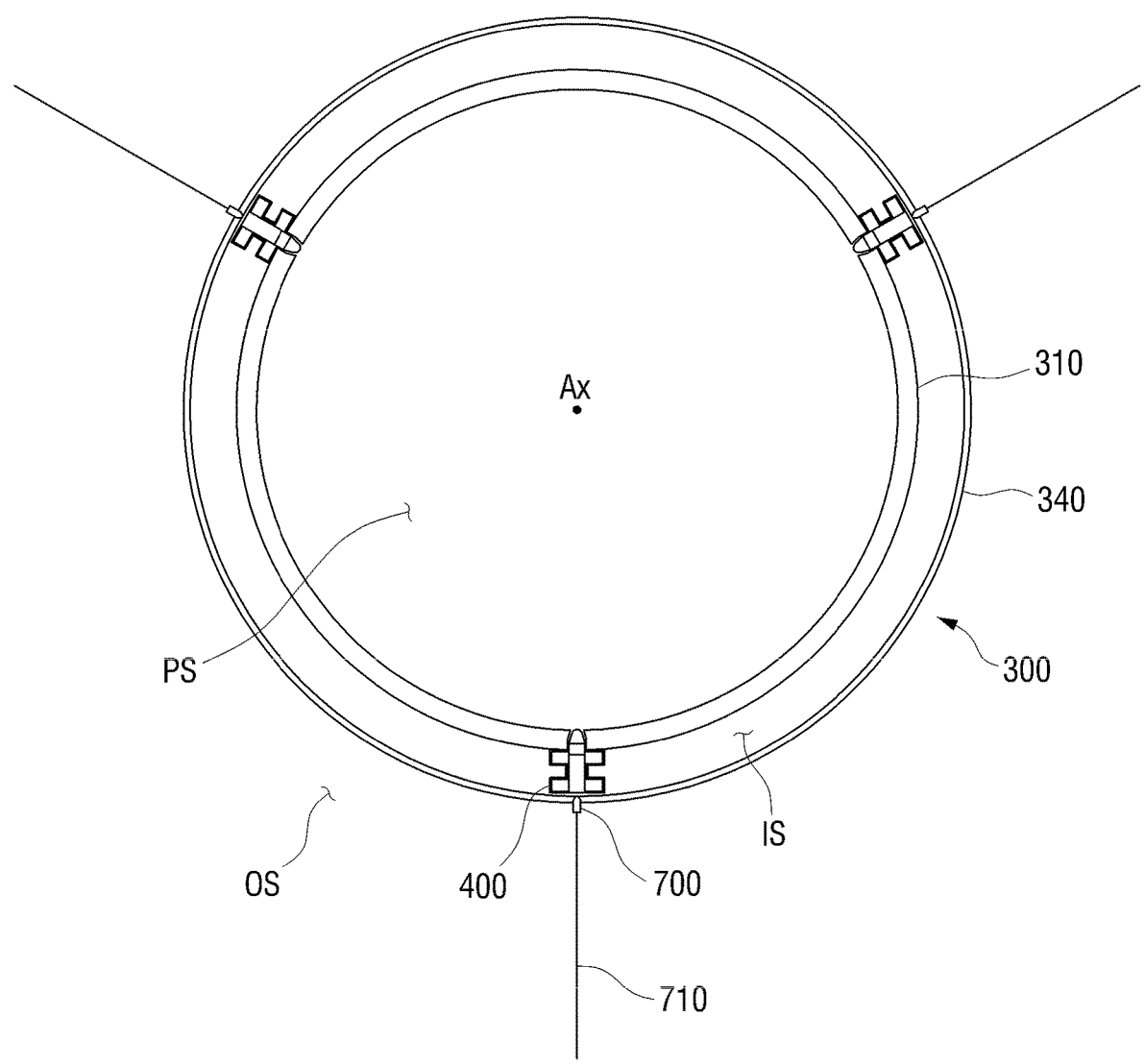
FIG. 5 is a view illustrating that a centering part is installed in the guide ring according to the exemplary embodiment of the present disclosure.
Figure 6:
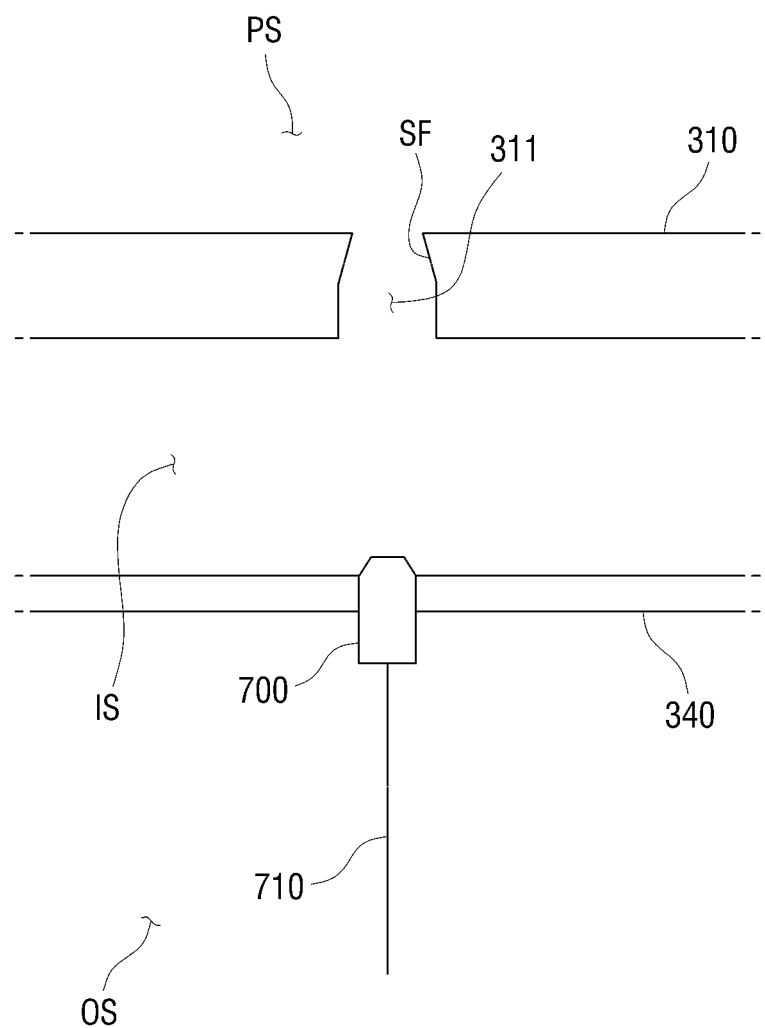
FIG. 6 is a view illustrating a portion of the guide ring provided with the centering part according to the exemplary embodiment of the present disclosure.

FIG. 5 is a view illustrating that the centering part is installed in the guide ring according to the exemplary embodiment of the present disclosure, and FIG. 6 is a view illustrating a portion of the guide ring provided with the centering part according to the exemplary embodiment of the present disclosure.

Referring to FIG. 5, the centering part 400 may be installed in the guide ring 300. As described above, the guide ring 300 may include an inner space IS, and the centering part 400 may be installed in the corresponding space.

At least three centering parts 400 may be installed in the guide ring 300. FIG. 5 illustrates that three centering parts 400 are installed between the inner side plate 310 and the outer side plate 340 of the guide ring 300. As the three centering parts 400 simultaneously press different edges of the substrate W, the centering of the substrate W may be performed.

Referring to FIG. 6, the guide ring 300 may include a through hole 311 provided with an inclined surface SF. The inclined surface SF may correspond to a shape of an inclined part 421 of the centering part 400, which will be described below.

The through hole 311 may be provided in the inner side plate 310 of the guide ring 300. The through hole 311 may be formed to connect the inner space IS of the guide ring 300 to the seating space PS. A portion of the through hole 311, which is in contact with the seating space PS of the inner side plate 310, may include the inclined surface SF whose diameter decreases in a direction from the outer space OS toward the seating space PS.

The outer side plate 340 may be provided with the air nozzle 700. An opening of the air nozzle 700 may be positioned in the inner space IS of the guide ring 300. Accordingly, the air nozzle 700 may inject air into the inner space IS or suction air in the inner space IS.

Figure 7:
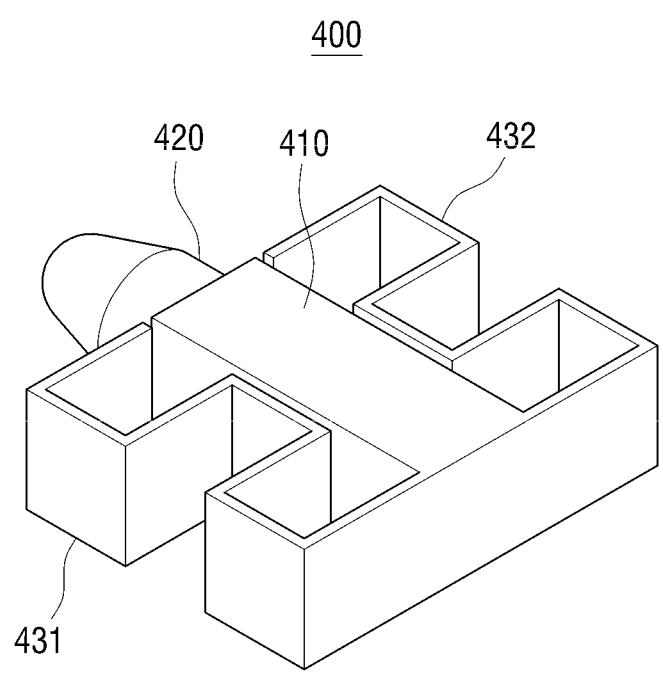
FIGS. 7 and 8 are views illustrating the centering part according to the exemplary embodiment of the present disclosure.
Figure 8:
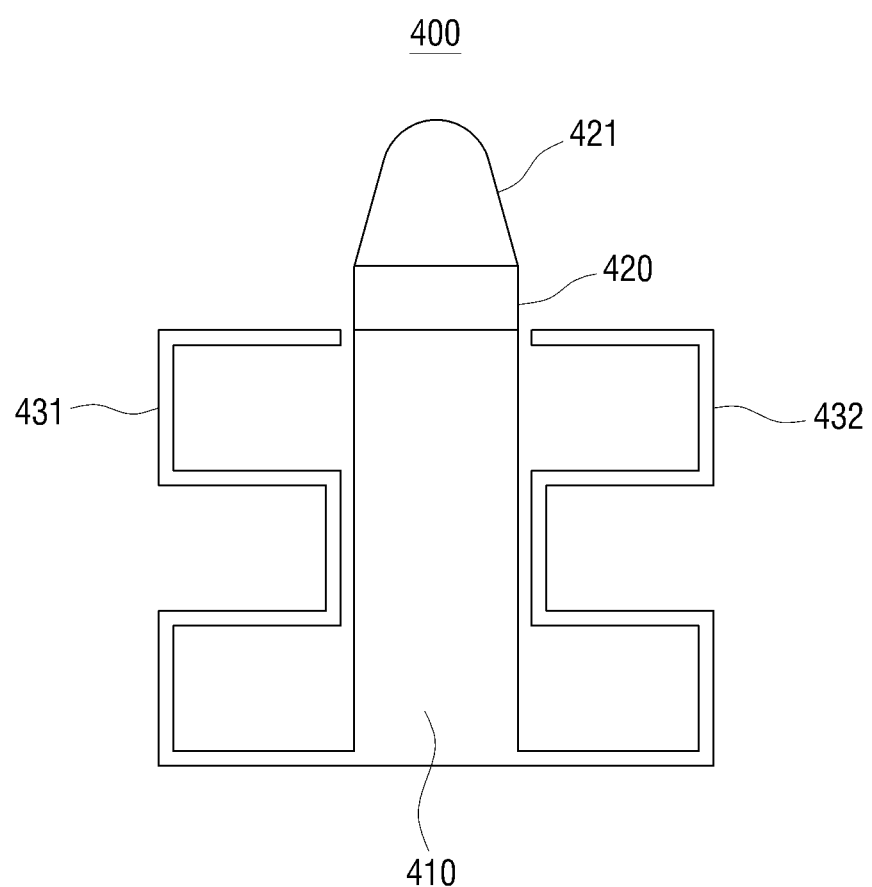
Figure 9:
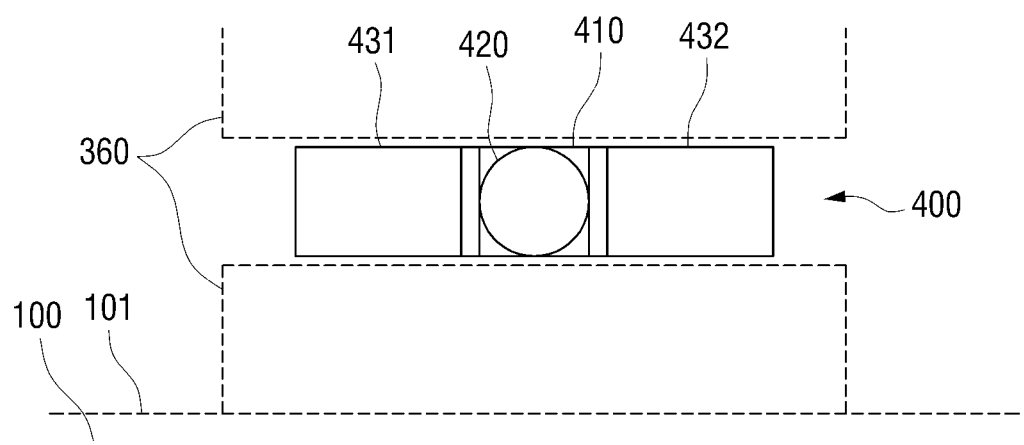
FIG. 9 is a view illustrating a disposed posture of the centering part according to the exemplary embodiment of the present disclosure.

FIGS. 7 and 8 are views illustrating the centering part according to the exemplary embodiment of the present disclosure, and FIG. 9 is a view illustrating a disposed posture of the centering part according to the exemplary embodiment of the present disclosure.

Referring to FIGS. 7 and 8, the centering part 400 includes a body 410, a head 420, and the elastic bodies 431 and 432.

The body 410 may be formed to be elongated to one side thereof. The body 410 may be disposed to be elongated in a direction from the outer space OS of the guide ring 300 toward the seating space PS of the guide ring 300 (see FIG. 5). Specifically, a major axis of the body 410 may be disposed to be elongated toward the central axis Ax of the substrate support part 100.

The head 420 is provided at one side end of the body 410 and moves together with the body 410 to serve to pressurize the edge of the substrate W. The head 420 may include the inclined part 421 whose diameter decreases toward the substrate W. That is, the head 420 may have a diameter which becomes smaller in a direction away from a portion thereof in contact with the body 410.

Due to the movement of the head 420, the inclined part 421 may be brought into contact with the inclined surface SF of the through hole 311 formed in the guide ring 300. When the inclined part 421 is brought into contact with the inclined surface SF, a portion of the head 420 may be exposed to the outside of the through hole 311 to pressurize the edge of the substrate W. The detailed description thereof will be described below with reference to FIG. 12.

The elastic bodies 431 and 432 may provide elastic force to elastically move the body 410 with respect to the substrate support part 100. To this end, one side of each of the elastic bodies 431 and 432 may be fixed to the substrate support part 100, and the other sides thereof may be connected to the body 410.

The elastic bodies 431 and 432 may include a first elastic body 431 and a second elastic body 432. The first elastic body 431 and the second elastic body 432 may be disposed on both sides of the body 410. That is, the first elastic body 431 may be disposed on one side of the body 410, and the second elastic body 432 may be disposed on an opposite side to the one side on which the first elastic body 431 is disposed with the body 410 as a center. The first elastic body 431 and the second elastic body 432 may have a symmetrical shape with respect to the body 410.

Since the first elastic body 431, the body 410, and the second elastic body 432 are arranged side-by-side, an assembly of the body 410, the first elastic body 431, and the second elastic body 432 may have a plate shape. As illustrated in FIG. 9, a wide surface of the assembly of the body 410, the first elastic body 431, and the second elastic body 432 may be disposed to be parallel with the seating surface 101 of the substrate support part 100. Accordingly, when a supporting device 360 configured to support upper and lower side surfaces of the assembly is provided inside the guide ring 300, the vertical movement of the assembly may be prevented, and the stable movement of the body 410 may be performed.

Figure 10:
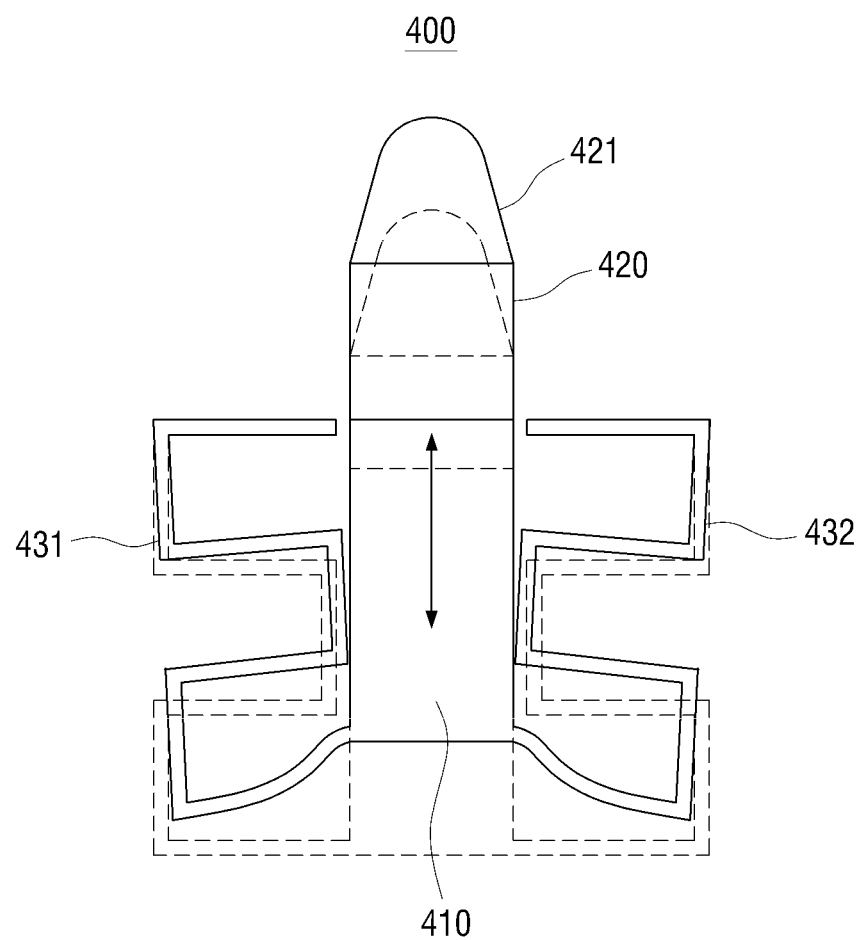
FIG. 10 is a view illustrating the movement of the centering part according to the exemplary embodiment of the present disclosure.

FIG. 10 is a view illustrating the movement of the centering part according to the exemplary embodiment of the present disclosure;

Referring to FIG. 10, the body 410 of the centering part 400 may perform a linear movement. That is, the body 410 may perform the linear movement in a major axis direction.

When external force is greater than the elastic force of the elastic bodies 431 and 432, the body 410 may be moved in the direction of the external force. Meanwhile, when the external force is removed, the body 410 may be returned to an original position thereof by the elastic force of the elastic bodies 431 and 432.

Figure 11:
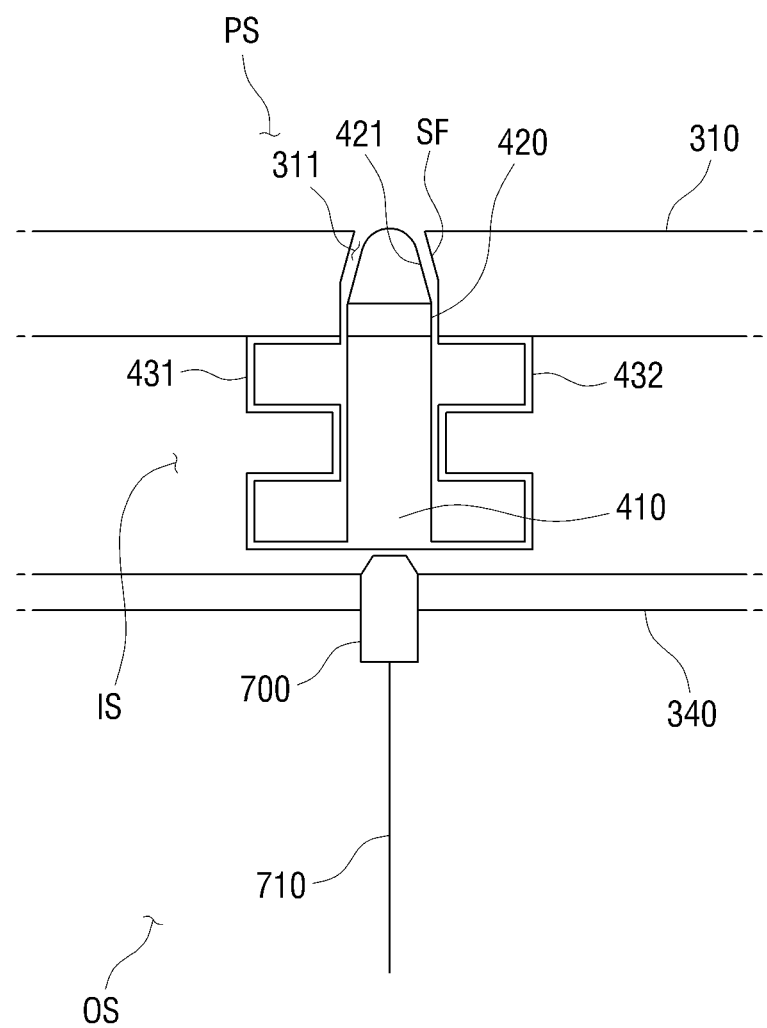
FIGS. 11 and 12 are views illustrating a centering operation of the centering part according to the exemplary embodiment of the present disclosure.
Figure 12:
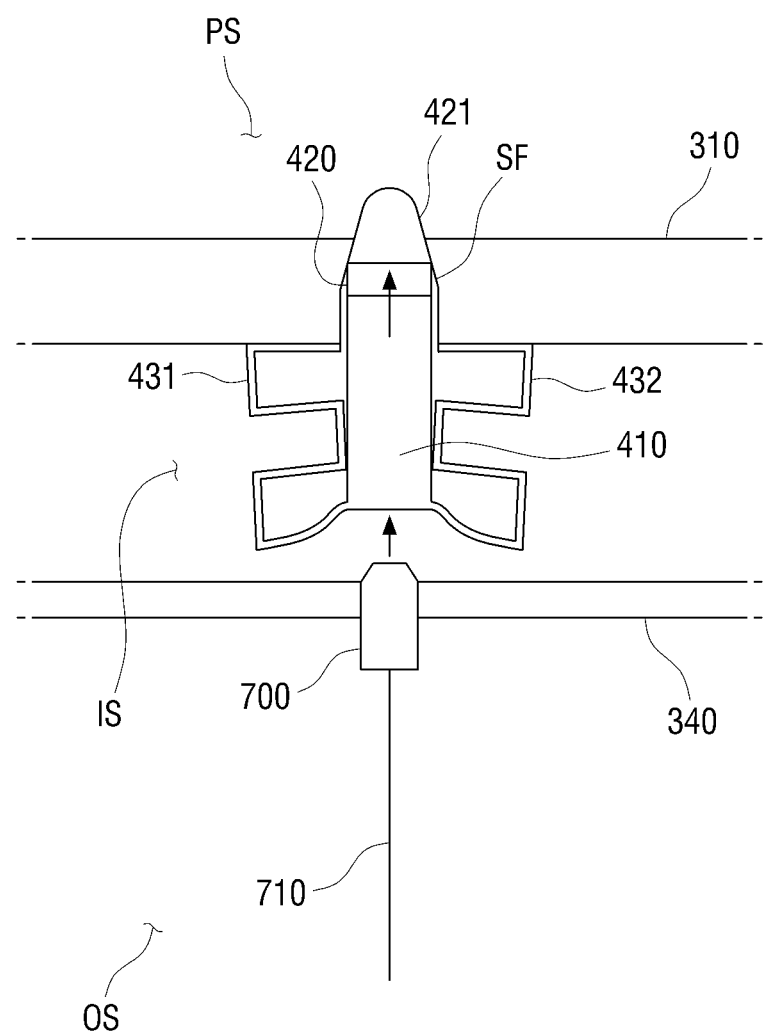

FIGS. 11 and 12 are views illustrating a centering operation of the centering part according to the exemplary embodiment of the present disclosure.

Referring to FIG. 11, the centering part 400 may be installed inside the guide ring 300. The one sides of each of the elastic bodies 431 and 432 may be fixed to the inner side plate 310 of the guide ring 300, and the other sides thereof may be connected to the body 410. The air nozzle 700 may be disposed to be adjacent to the body 410. The air nozzle 700 may be disposed to be adjacent to one side of the body 410 on which the head 420 is not provided.

FIG. 11 is a view illustrating a case in which the external force, that is, air injection force by the air nozzle 700 does not act and only the elastic force of the elastic bodies 431 and 432 acts on the body 410, and in this case, the head 420 may not be exposed to the seating space PS.

Referring to FIG. 12, when the air is injected from the air nozzle 700, the body 410 may be pushed and moved. Here, the force of the air may be greater than the elastic force of the elastic bodies 431 and 432.

Since the air injected from the air nozzle 700 pushes the body 410, the head 420 may be moved so that a portion of the head 420 may be exposed to the seating space PS. The portion of the head 420 exposed to the seating space PS may pressurize the edge of the substrate W.

As the head 420 moves, the inclined part 421 of the head 420 may be brought into contact with the inclined surface SF of the through hole 311, and the movement of the head 420 may be limited. That is, the length of the head 420 exposed to the seating space PS may be uniformly formed regardless of the force of the air. The centering of the substrate W may be performed by exposing the heads 420 of the plurality of centering parts 400 installed in the guide ring 300 to the seating space PS by predetermined lengths to push the substrate W toward the center of the substrate support part 100.

When the air injection of the air nozzle 700 is stopped, the body 410 may be returned to the original position thereof by the elastic force of the elastic bodies 431 and 432, and the pressure applied on the edge of the substrate W due to the head 420 may be released. That is, when the air injection of the air nozzle 700 is stopped, as shown in FIG. 11, the body 410 may return to the original position thereof and the head 420 exposed to the seating space PS may be removed.

Figure 13:
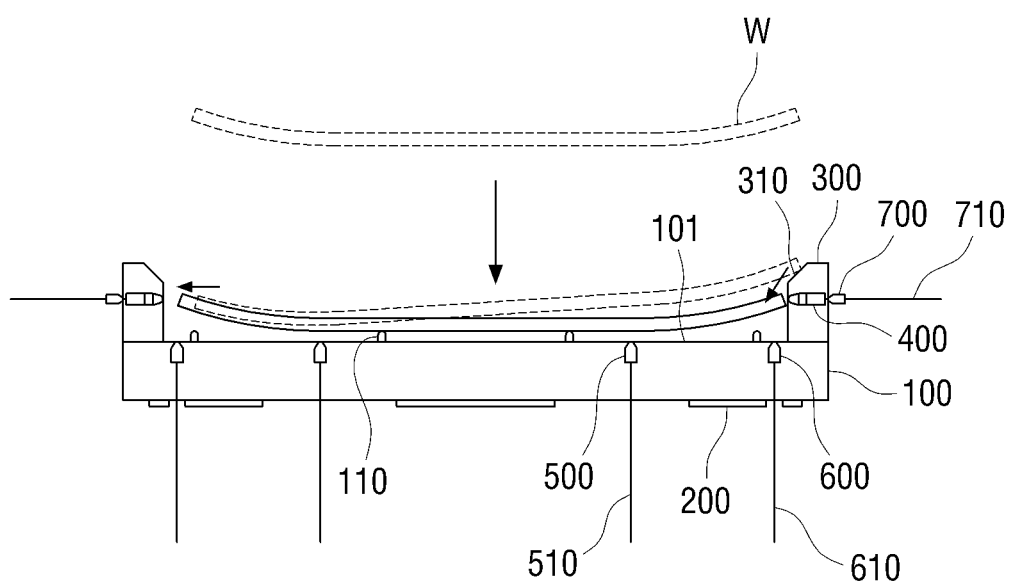
FIGS. 13 and 14 are views illustrating the substrate seated on the substrate treatment apparatus according to the exemplary embodiment of the present disclosure being centered.
Figure 14:
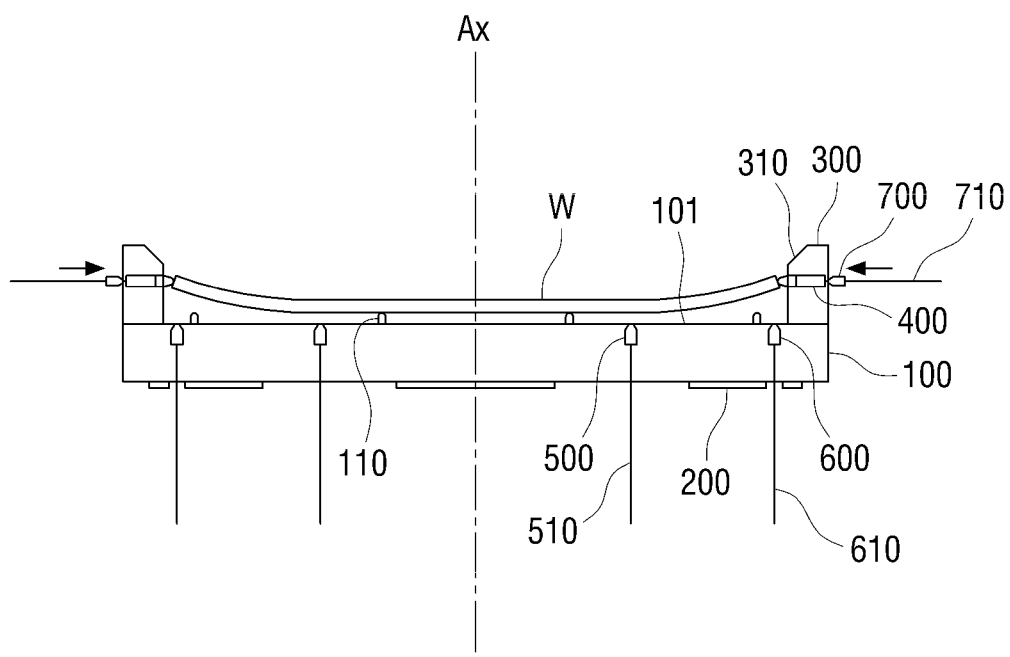

FIGS. 13 and 14 are views illustrating that the substrate seated on the substrate treatment apparatus according to the exemplary embodiment of the present disclosure is being centered.

Referring to FIG. 13, the substrate W may be seated on and supported by the substrate support part 100. First, the substrate W may be transported by a transport robot (not shown) and seated on the substrate support part 100.

Here, the substrate W may be seated in a state in which a portion of the substrate W is not included in the seating space PS. That is, the edge of the substrate W may be brought into contact with the guide ring 300. As described above, the guide ring 300 may include the inclined plate 320. When the edge of the substrate W is brought into contact with the inclined plate 320, the substrate W may be guided to the inclined plate 320 and moved to the seating space PS.

The heating part 200 attached to the substrate support part 100 may operate to heat the substrate W. The heat of the heating part 200 may be transferred to the substrate W through the substrate support part 100. The heat may also be transferred through the guide ring 300 connected to the substrate support part 100. When the edge of the substrate W is brought into contact with the guide ring 300, the corresponding portion of the substrate W being brought into contact with the guide ring 300 receives the heat not only through the substrate support part 100 but also through the guide ring 300. When the heat is transferred in a composite manner, the corresponding portion of the substrate W may be deformed.

In order to prevent the heat from being transferred through the guide ring 300, the centering of the substrate W may be performed. Referring to FIG. 14, the centering part 400 may perform the centering of the substrate W after the substrate W is seated on the substrate support part 100. The body 410 of the centering part 400 is moved toward the central axis Ax of the substrate support part 100 by the force of the air injected from the air nozzle 700, and the head 420 pressurizes the edge of the substrate W, thereby performing the centering of the substrate W. After the centering of the substrate W is performed, the injection of air by the air nozzle 700 may be released, and the body 410 of the centering part 400 returns to the original position thereof.

Figure 15:
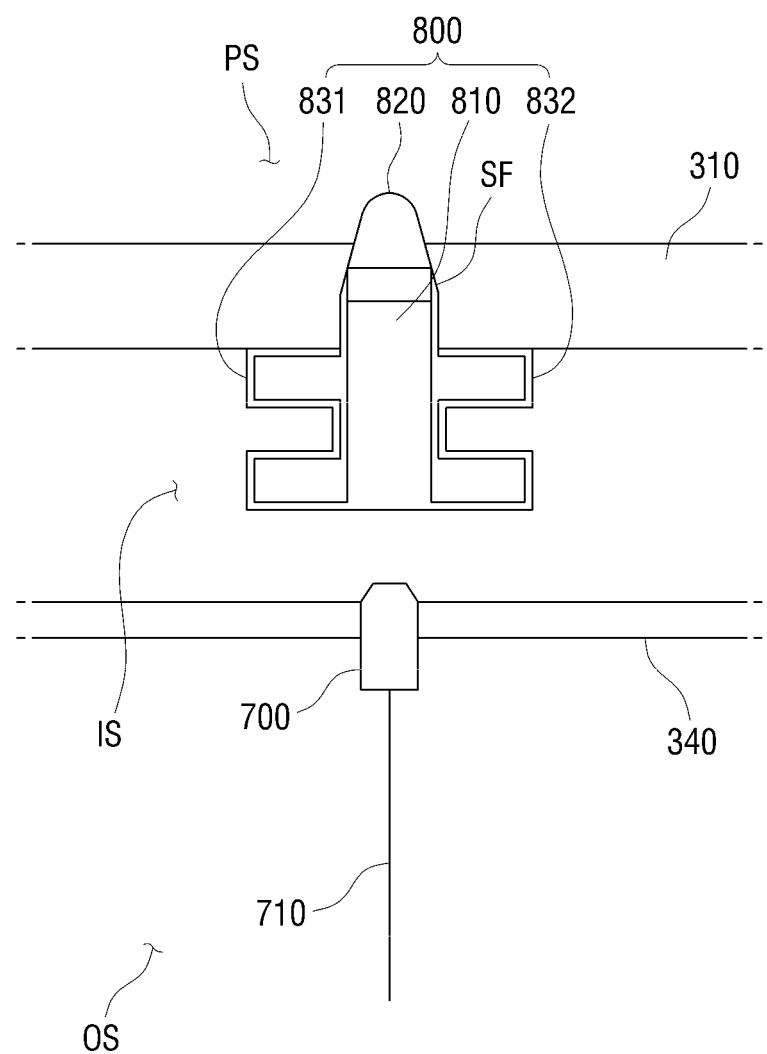
FIGS. 15 and 16 are views illustrating a centering operation of a centering part according to another exemplary embodiment of the present disclosure.
Figure 16:
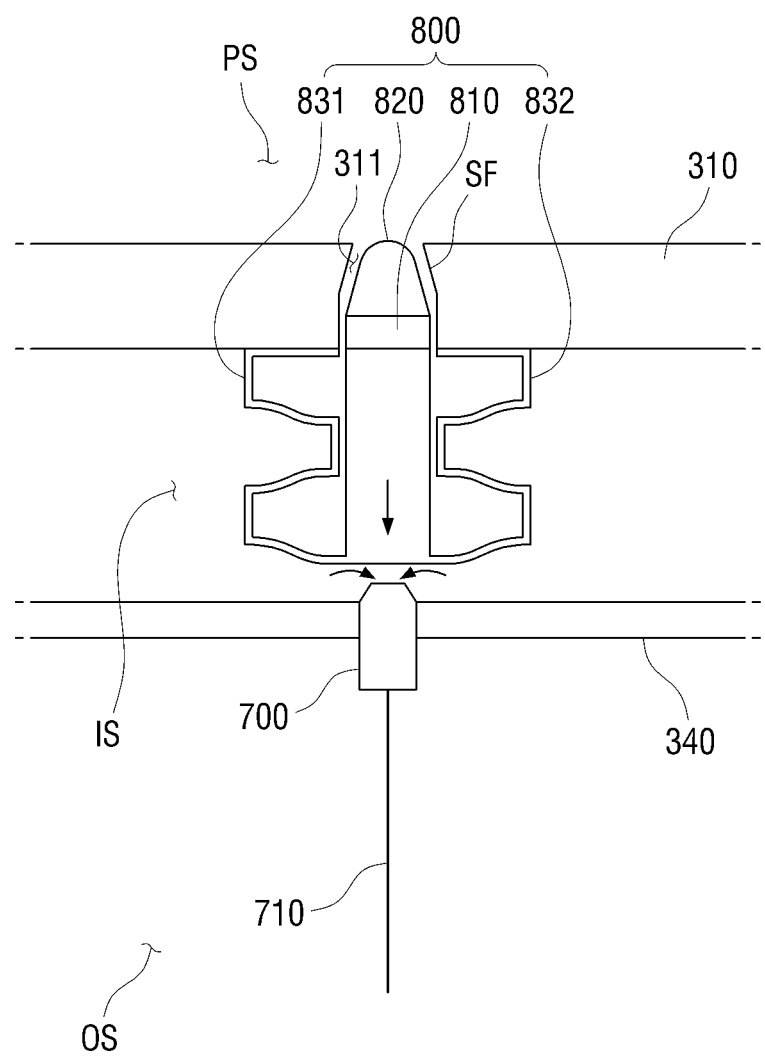

FIGS. 15 and 16 are views illustrating a centering operation of a centering part according to another exemplary embodiment of the present disclosure.

Referring to FIG. 15, a centering part 800 may include a body 810, a head 820, and elastic bodies 831 and 832. The shapes and functions of the body 810, the head 820, and the elastic bodies 831 and 832 are the same as or similar to those of the body 410, the head 420, and the elastic bodies 431 and 432, which are described above, and accordingly, the difference will be mainly described. In FIG. 15, an air nozzle 700 may suction air. That is, the air nozzle 700 may suction air in an inner space IS of a guide ring 300.

When there is no air suction force of the air nozzle 700, a portion of the head 820 may be exposed to a seating space PS. That is, when the air suction of the air nozzle 700 is stopped, the head 820 connected to the body 810 may pressurize an edge of a substrate W by elastic force of the elastic bodies 831 and 832. Meanwhile, as illustrated in FIG. 16, when the air nozzle 700 suctions the air to pull the body 810, the head 820 is moved to release the pressure applied on the edge of the substrate W by the head 820.

The air nozzle 700 may first suction the air and pull the body 810 to perform the centering of the substrate W. Subsequently, the air suction by the air nozzle 700 may be stopped after the substrate W is seated on the substrate support part 100. Accordingly, since the body 810 is moved, the head 820 may pressurize the substrate W so that the centering of the substrate W may be performed. After the centering of the substrate W is performed, the air suction by the air nozzle 700 may be performed again so that the pressure applied on the substrate W by the head 820 may be released.

Although the exemplary embodiments of the present disclosure have been described with reference to the accompanying drawings, it will be understood by those skilled in the art that the disclosure may be performed in other concrete forms without changing the technological scope and essential features. Therefore, the above-described exemplary embodiments should be considered as only examples in all aspects and not for purposes of limitation.

What is claimed is:

1. A substrate treatment apparatus comprising:
a substrate support part provided with a seating surface and configured to support a substrate;
a guide ring annularly disposed along an edge of the substrate support part to surround the substrate; and
a centering part including a body provided inside the guide ring, the body configured to center the substrate by moving into and out of the guide ring into a space above the seating surface in a linear direction parallel to the seating surface toward a central axis of the guide ring to pressurize an edge of the substrate, the centering part further comprising at least one elastic body configured to elastically move the body with respect to the substrate support part,
wherein the centering part further includes:
a head provided at one side end of the body and configured to move together with the body to pressurize the edge of the substrate; and
the at least one elastic body comprises a plurality of elastic bodies each having one side fixed to the substrate support part and the other side connected to the body to provide an elastic force in a linear direction parallel to the seating surface away from the central axis of the guide ring to elastically move the body with respect to the substrate support part.

2. The substrate treatment apparatus of claim 1, wherein the substrate support part includes a first air suction nozzle and a second air suction nozzle that are configured to suction air,
the first air suction nozzle fixes the substrate to the substrate support part with a suction force, and
the second air suction nozzle suctions particles present between the substrate and the substrate support part with a suction force.

3. The substrate treatment apparatus of claim 2, wherein the first air suction nozzle is disposed to be adjacent to a center of the seating surface, and
the second air suction nozzle is disposed along an edge of the seating surface.

4. The substrate treatment apparatus of claim 1, wherein the guide ring includes:
an inner side plate having a wide surface, which is perpendicular to the seating surface, and formed in an annular shape to surround the substrate; and
an inclined plate formed to annularly extend from an upper end of the inner side plate to surround the substrate and having a diameter that increases away from the seating surface.

5. The substrate treatment apparatus of claim 4, wherein a height of the inner side plate with respect to the seating surface is formed to be greater than a height of the edge of the substrate supported on the substrate support part.

6. The substrate treatment apparatus of claim 5, wherein the substrate support part includes a support pin that supports the substrate,
the substrate includes a warpage substrate in which a distance between the edge of the substrate and the seating surface is formed to be greater than a distance between a center portion of the substrate and the seating surface, and
the height of the inner side plate with respect to the seating surface is formed to be greater than the height of the edge of the warpage substrate that is supported on the support pin.

7. The substrate treatment apparatus of claim 1, further comprising a heating part attached to the substrate support part and configured to heat the substrate.

8. The substrate treatment apparatus of claim 1, wherein the elastic bodies include:
a first elastic body disposed on one side of the body; and
a second elastic body disposed on the opposite side to the one side on which the first elastic body is disposed with the body as a center.

9. The substrate treatment apparatus of claim 8, wherein an assembly of the body, the first elastic body, and the second elastic body has a plate shape, and
the assembly has a wide surface disposed to be parallel to the seating surface.

10. The substrate treatment apparatus of claim 1, wherein the head includes an inclined part whose diameter decreases toward the substrate.

11. The substrate treatment apparatus of claim 10, wherein
the guide ring includes a through-hole having an inclined surface corresponding to a shape of the inclined part, and
a portion of the head is exposed to the outside of the through-hole to pressurize the edge of the substrate when the inclined part is brought into contact with the inclined surface.

12. The substrate treatment apparatus of claim 11, wherein
the substrate support part includes an air nozzle configured to inject air,
the head is moved to pressurize the edge of the substrate as the air injected from the air nozzle pushes the body, and
when the air injection of the air nozzle is stopped, the body is returned to an original position thereof by the elastic force of the elastic bodies to release a pressure applied on the edge of the substrate by the head.

13. The substrate treatment apparatus of claim 11, wherein
the substrate support part includes an air nozzle configured to suction air,
when the air suction of the air nozzle is stopped, the head connected to the body by the elastic force of the elastic bodies pressurizes the edge of the substrate, and when the air nozzle suctions the air to pull the body, the head is moved to release a pressure applied on the edge of the substrate by the head.

\* \* \* \* \*